(12) United States Patent
Wasserman et al.

(10) Patent No.: US 9,478,516 B2
(45) Date of Patent: Oct. 25, 2016

(54) METHODS OF OPERATING BONDING MACHINES FOR BONDING SEMICONDUCTOR ELEMENTS, AND BONDING MACHINES

(71) Applicant: Kulicke and Soffa Industries, Inc., Fort Washington, PA (US)

(72) Inventors: Matthew B. Wasserman, Philadelphia, PA (US); Michael P. Schmidt-Lange, North Wales, PA (US); Thomas J. Colosimo, Jr., West Chester, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 14/855,848

(22) Filed: Sep. 16, 2015

(65) Prior Publication Data

US 2016/0005709 A1 Jan. 7, 2016

Related U.S. Application Data

(63) Continuation of application No. 14/567,031, filed on Dec. 11, 2014, now Pat. No. 9,165,902.

(60) Provisional application No. 61/916,912, filed on Dec. 17, 2013.

(51) Int. Cl.
*B23K 37/00* (2006.01)
*H01L 23/00* (2006.01)
(Continued)

(52) U.S. Cl.
CPC .............. *H01L 24/75* (2013.01); *B23K 1/0016* (2013.01); *B23K 3/00* (2013.01); *B23K 3/04* (2013.01); *B23K 3/08* (2013.01); *B23K 31/12* (2013.01); *H01L 21/00* (2013.01); *H01L 22/10* (2013.01); *H01L 24/81* (2013.01); *H05K 3/34* (2013.01); *H01L 24/13* (2013.01); *H01L 2224/131* (2013.01); *H01L 2224/13147* (2013.01); *H01L 2224/75001* (2013.01);
(Continued)

(58) Field of Classification Search
USPC .......... 228/102–103, 179.1–180.22, 4.1, 6.2, 228/8–10, 12, 49.5, 44.7
See application file for complete search history.

(56) References Cited

U.S. PATENT DOCUMENTS 4,597,519 A * 7/1986 Kurtz ................... B23K 20/007
219/56.21
4,832,253 A * 5/1989 Kloucek ................. H01L 24/26
228/123.1

(Continued)

FOREIGN PATENT DOCUMENTS

EP 0949670 10/1999
ES WO 2013171355 A1 * 11/2013 ........... B23K 20/123
(Continued)

*Primary Examiner* — Kiley Stoner
(74) *Attorney, Agent, or Firm* — Stradley Ronon Stevens & Young, LLP

(57) ABSTRACT

A method of operating a bonding machine for bonding semiconductor elements is provided. The method includes the steps of: (a) measuring a time based z-axis height measurement characteristic of a bond head assembly during a model bonding process; (b) determining a z-axis adjustment profile for a subsequent bonding process based on the measured time based z-axis height measurement characteristic; and (c) adjusting a z-axis position of the bond head assembly with a z-axis motion system during the subsequent bonding process using the z-axis adjustment profile.

15 Claims, 11 Drawing Sheets

(51) Int. Cl.
    *B23K 1/00*     (2006.01)
    *B23K 31/12*     (2006.01)
    *H01L 21/66*     (2006.01)
    *B23K 3/00*     (2006.01)
    *H05K 3/34*     (2006.01)
    *H01L 21/00*     (2006.01)
    *B23K 3/04*     (2006.01)
    *B23K 3/08*     (2006.01)

(52) U.S. Cl.
    CPC ............... *H01L 2224/7592* (2013.01); *H01L 2224/75252* (2013.01); *H01L 2224/75301* (2013.01); *H01L 2224/75702* (2013.01); *H01L 2224/75841* (2013.01); *H01L 2224/75842* (2013.01); *H01L 2224/75901* (2013.01); *H01L 2224/81121* (2013.01); *H01L 2224/81201* (2013.01); *H01L 2224/81203* (2013.01); *H01L 2224/81801* (2013.01); *H01L 2224/81815* (2013.01); *H01L 2224/81986* (2013.01)

(56) References Cited

U.S. PATENT DOCUMENTS

| | | | | |
|---|---|---|---|---|
| 5,591,920 | A * | 1/1997 | Price | B23K 31/125 228/4.5 |
| 5,673,844 | A | 10/1997 | Sargent | |
| 5,984,165 | A | 11/1999 | Inoue et al. | |
| 6,131,795 | A | 10/2000 | Sato | |
| 6,164,518 | A * | 12/2000 | Mochida | B23K 20/004 228/102 |
| 6,337,489 | B1 * | 1/2002 | Matsumoto | H01L 21/67144 228/105 |
| 6,494,359 | B1 | 12/2002 | Hasegawa | |
| 6,523,249 | B1 * | 2/2003 | Matsumoto | G11B 5/486 29/603.03 |
| 6,543,668 | B1 * | 4/2003 | Fujii | B23K 20/023 228/103 |
| 7,780,056 | B2 | 8/2010 | Seyama | |
| 7,810,698 | B2 | 10/2010 | Chung et al. | |
| 8,292,159 | B2 | 10/2012 | Maki et al. | |
| 8,367,962 | B2 | 2/2013 | Zaffino et al. | |
| 2002/0030089 | A1 * | 3/2002 | Leu | H01L 21/67144 228/248.1 |
| 2002/0104870 | A1 | 8/2002 | Nogawa | |
| 2003/0164396 | A1 | 9/2003 | Suga et al. | |
| 2005/0071991 | A1 * | 4/2005 | Yonezawa | H05K 13/0413 29/740 |
| 2005/0098610 | A1 * | 5/2005 | Onobori | B23K 1/0016 228/180.21 |
| 2006/0076388 | A1 * | 4/2006 | Sato | B23K 1/018 228/102 |
| 2006/0113350 | A1 * | 6/2006 | Ozaki | B23K 1/0016 228/1.1 |
| 2007/0099412 | A1 | 5/2007 | Miyazaki | |
| 2007/0181644 | A1 * | 8/2007 | Ueno | H01L 24/81 228/101 |
| 2008/0017293 | A1 | 1/2008 | Chung et al. | |
| 2008/0073409 | A1 | 3/2008 | Ostersehlte | |
| 2008/0083817 | A1 | 4/2008 | Baumann et al. | |
| 2008/0135601 | A1 | 6/2008 | Chen et al. | |
| 2008/0210383 | A1 | 9/2008 | Hirata | |
| 2008/0245843 | A1 * | 10/2008 | Suga | B23K 20/023 228/3.1 |
| 2009/0127315 | A1 * | 5/2009 | Okita | H01L 24/75 228/102 |
| 2009/0289098 | A1 * | 11/2009 | Terada | H01L 24/75 228/102 |
| 2010/0072262 | A1 | 3/2010 | Sugawara et al. | |
| 2010/0243153 | A1 * | 9/2010 | Onitsuka | H01L 24/79 156/290 |
| 2011/0174442 | A1 * | 7/2011 | Kajii | B23K 1/0016 156/350 |
| 2011/0259941 | A1 * | 10/2011 | Kim | B23K 20/005 228/102 |
| 2012/0117796 | A1 * | 5/2012 | Kim | H01L 24/81 29/832 |
| 2012/0214258 | A1 | 8/2012 | Kihara et al. | |
| 2013/0153644 | A1 * | 6/2013 | Hojo | H01L 24/75 228/102 |
| 2014/0069564 | A1 * | 3/2014 | Takano | H01L 24/74 156/60 |
| 2014/0175159 | A1 * | 6/2014 | Kostner | H01L 24/81 228/102 |
| 2014/0312018 | A1 * | 10/2014 | Leslie | B23K 26/38 219/121.81 |

FOREIGN PATENT DOCUMENTS

| | | | |
|---|---|---|---|
| JP | 01161727 | 6/1989 | |
| JP | 02065146 A * | 3/1990 | |
| JP | WO 0249094 A1 * | 6/2002 | ....... H01L 21/67144 |
| JP | WO 2010013764 A1 * | 2/2010 | ............ H01L 24/75 |
| WO | WO0249094 | 6/2002 | |

* cited by examiner

METHODS OF OPERATING BONDING MACHINES FOR BONDING SEMICONDUCTOR ELEMENTS, AND BONDING MACHINES

CROSS REFERENCE TO RELATED APPLICATION

This application is a continuation of U.S. patent application Ser. No. 14/567,031, filed Dec. 11, 2014, which claims the benefit of U.S. Provisional Patent Application No. 61/916,912, filed Dec. 17, 2013, the content of each of which is incorporated herein by reference.

FIELD OF THE INVENTION

The present invention relates to the formation of semiconductor packages, and more particularly, to improved methods of operating bonding machines for bonding semiconductor elements.

BACKGROUND OF THE INVENTION

In certain aspects of the semiconductor packaging industry, semiconductor elements are bonded to bonding locations. For example, in conventional die attach (also known as die bonding) applications, a semiconductor die is bonded to a bonding location of a substrate (e.g., a leadframe, another die in stacked die applications, a spacer, etc.). In advanced packaging applications, semiconductor elements (e.g., bare semiconductor die, packaged semiconductor die, etc.) are bonded to bonding locations of a substrate (e.g., a leadframe, a PCB, a carrier, a semiconductor wafer, a BGA substrate, etc.), with conductive structures (e.g., conductive bumps, contact pads, solder bumps, conductive pillars, copper pillars, etc.) providing electrical interconnection between the semiconductor element and the bonding location.

In many applications (e.g., thermocompression bonding of semiconductor elements), solder material is included in the conductive structures. In many such processes, heat is applied to the semiconductor element being bonded (e.g., through a heater in a bond head assembly carrying the bonding tool). Heat may also be applied to the substrate (configured to receive the semiconductor element) through a support structure. Through the cyclical application of heat (e.g., through the heater in the bond head assembly), and through changes to the system based on time, expansion and retraction of elements of the bond head assembly may lead to an undesirable result.

Thus, it would be desirable to provide improved methods for operating bonding machines for bonding semiconductor elements.

SUMMARY OF THE INVENTION

According to an exemplary embodiment of the present invention, a method of operating a bonding machine for bonding semiconductor elements is provided. The method includes the steps of: (a) measuring a time based z-axis height measurement characteristic of a bond head assembly during a model bonding process; (b) determining a z-axis adjustment profile for a subsequent bonding process based on the measured time based z-axis height measurement characteristic; and (c) adjusting a z-axis position of the bond head assembly with a z-axis motion system during the subsequent bonding process using the z-axis adjustment profile.

According to another exemplary embodiment of the present invention, a method of operating a bonding machine for bonding semiconductor elements is provided. The method includes the steps of: (a) measuring temperature values at a plurality of positions of a bond head assembly; (b) determining a z-axis adjustment using the temperature values measured at step (a); and (c) adjusting a z-axis position of the bond head assembly during a bonding process using a z-axis motion system based on the z-axis adjustment determined in step (b).

According to an exemplary embodiment of the present invention, a bonding machine for bonding semiconductor elements is provided. The bonding machine includes: a bond head assembly including a bonding tool for bonding semiconductor elements to a substrate; a support structure for supporting the substrate; a calibration station used in connection with the bond head assembly for measuring a time based z-axis height measurement characteristic of the bond head assembly during a model bonding process; and a computer for determining a z-axis adjustment profile for a subsequent bonding process based on the measured time based z-axis height measurement characteristic. For example, such a bonding machine may be a thermocompression bonding machine (e.g., a flip chip thermocompression bonder), amongst others. In such a machine, the bonding tool places and bonds a semiconductor element (e.g., a semiconductor die, an interposer, etc.) to the substrate, for example, by melting and re-solidifying solder bumps on the semiconductor element being placed to create solder bonds.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF THE INVENTION

Figure 1A:
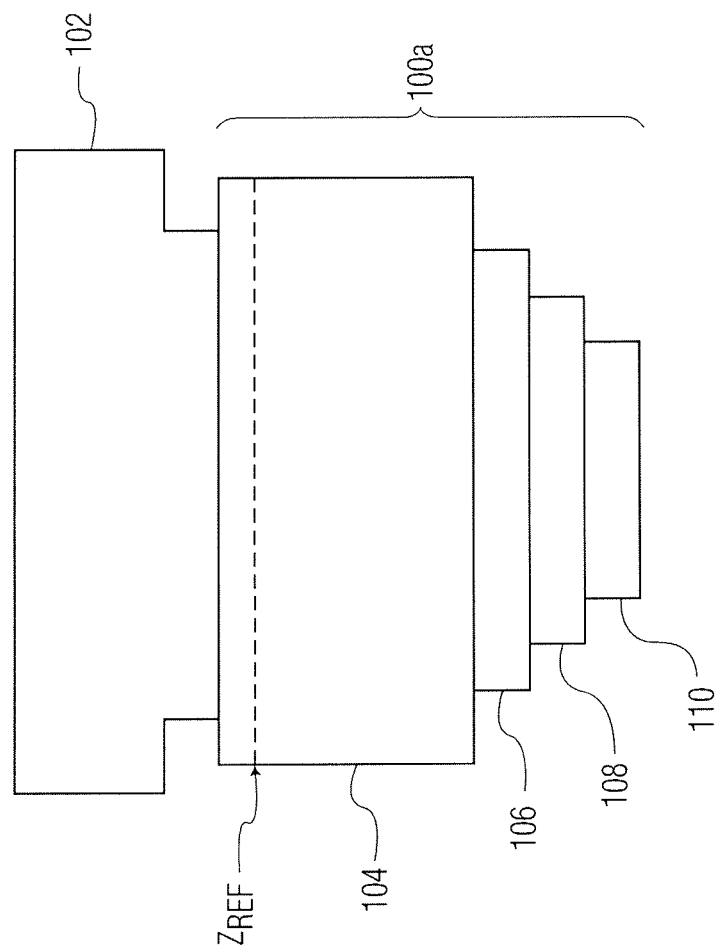
FIGS. 1A-1B are block diagram side views illustrating elements of bonding machines useful for explaining various exemplary embodiments of the present invention.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "substrate" is intended to refer to any structure to which a semiconductor element may be bonded (e.g., thermocompressively bonded, ultrasonically bonded, thermosonically bonded, die bonded, etc.). Exemplary substrates include, for example, a leadframe, a PCB, a carrier, a semiconductor chip, a semicondcutor wafer, a BGA substrate, a semiconductor element, etc.

As will be appreciated by those skilled in the art, bonding machines have differing motion system architectures. In the present application, specific bonding machine motion system architectures are described, with certain elements having certain motion axes; however, it is understood that the present invention is not limited to such architectures. More specifically, the exemplary motion system architecture (such as in FIG. 3) includes: (1) a support structure that is moveable along an x-axis direction; and (2) a bond head assembly (carrying a bonding tool) that is moveable along a y-axis direction, a z-axis direction, and about a theta axis. Again, it is clear that this architecture is exemplary in nature and the present invention has application to different architectures.

According to certain exemplary embodiments of the present invention, a local reflow solder semiconductor element attach process is provided. In this process, a bonding tool places and bonds a semiconductor element (e.g., a die, an interposer, etc.) to a substrate (e.g., a semiconductor chip, a semiconductor wafer, another substrate, etc.) by melting and re-solidifying solder bumps on the semiconductor element being placed. In one typical process, the bonding tool is in contact with the semiconductor element during the entire heating and cooling cycle of the bonding process, and the final bond height may be determined by the lowest position of the bond head assembly during solder bonding and at the time of solder solidification. Controlling the height of the finished solder bonds is a primary process control objective. Because the solder material included in the solder bumps is softened/molten during the bonding process, the process is desirably not controlled by bond force. Position control of the bonding head is considered desirable, typically by means of servo position control using position feedback along the z-axis (e.g., where the z-axis position is provided by a z-axis encoder). Such a position control process is made more difficult by the fact that rapid heating and cooling of the bond head assembly causes thermal growth (and contraction) of the bond head assembly, z-axis components, and the bond stage. As a result, actual changes in the bonding tool z-axis position that significantly impact positioning accuracy are common in a conventional system.

According to the present invention, various exemplary methods of compensating for the thermal growth (and contraction) are provided with the objective that the bonding tool be substantially maintained at an accurate height under servo position control, even as the bond head assembly structure is growing and shrinking due to heating and cooling. Exemplary methods include: (a) a calibrated open loop process by which the growth caused during a thermal cycle of the bond head assembly is learned, where this learned thermal growth (and contraction) is applied as an offset to the commanded z-axis position during position mode of the bonding cycle; (b) a closed loop temperature compensation process by which a number of discrete temperature sensors are provided and used in connection with stored data (e.g., data correlating temperature measurements to z-axis thermal growth (and contraction) of the bond head assembly and/or to z-axis position adjustments) to compensate for the thermal growth (and contraction) of the bond head assembly structure in real time; and (c) a hybrid approach combining elements of (a) and (b).

In connection with certain exemplary embodiments of the present invention, a model bonding process(es) may be conducted to develop data to be used in determining an appropriate z-axis position adjustment during an actual/subsequent bonding process. During one such model bonding process, bond head assembly growth (and contraction) along the z-axis may be measured by positioning the lower surface of the bond head assembly (e.g., the lower surface of the bonding tool) against a surface (e.g., a "dummy" device at the bond site area, a surface of a calibration station, etc.) and applying a constant force. Then the the actual temperature cycle of the current bond process program is applied. Using the z-axis encoder the net growth of the bond head assembly is measured (e.g., using a reference point of the bond head assembly referred to herein as $Z_{REF}$). This measured growth (and contraction) will approximate the growth (and contraction) that will occur during an actual/subsequent bonding process having the same process parameters (e.g., the same temperature cycle).

Figure 3:
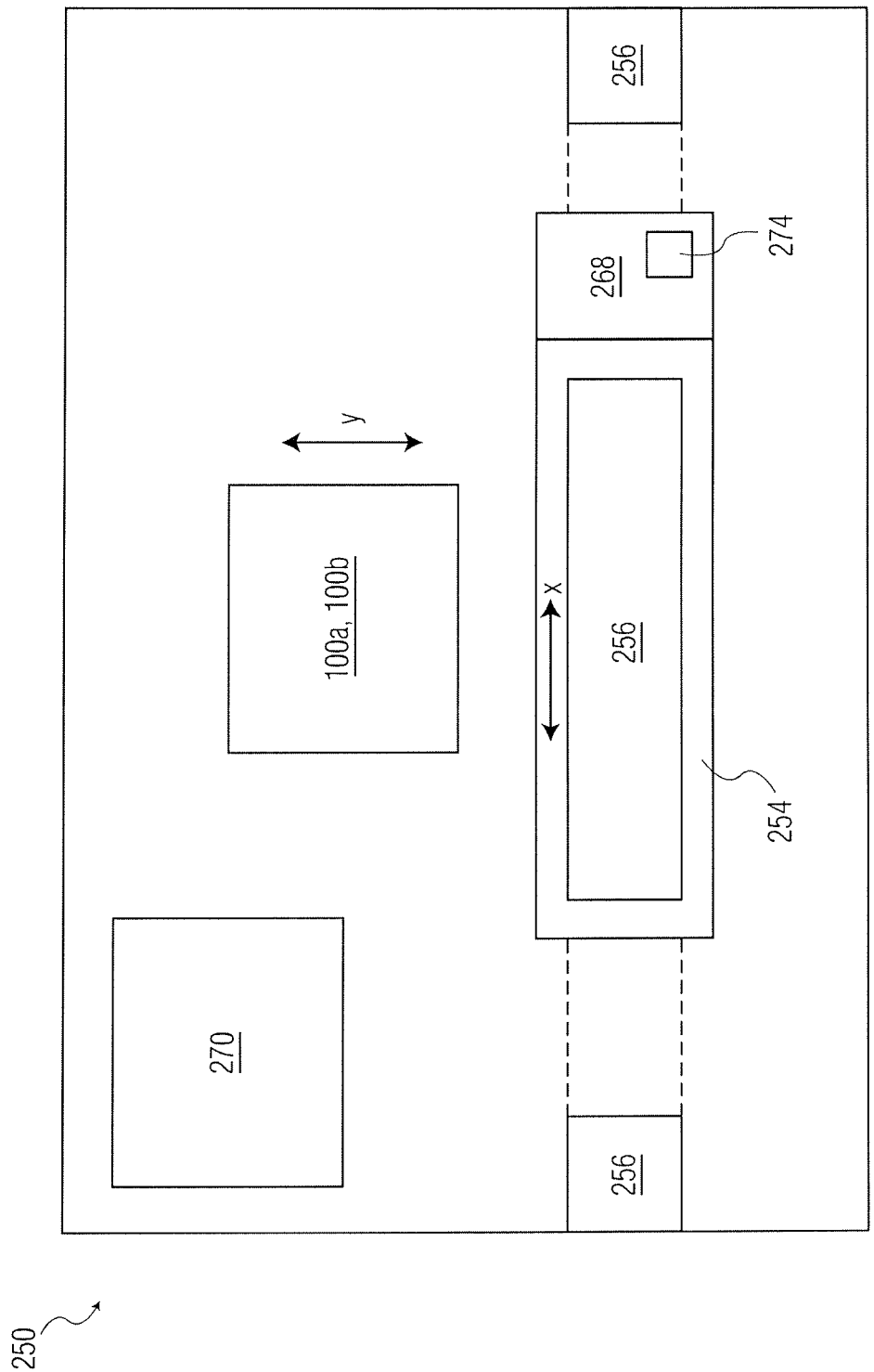
FIG. 3 is an overhead block diagram view of a bonding machine in accordance with an exemplary embodiment of the present invention.

According to another exemplary model bonding process, bond head assembly growth (and contraction) along the z-axis may be measured "in air" (e.g., not against a surface, such as the dummy device referenced above) by holding the z-axis position of a reference point (e.g., a z-axis encoder reference point) of the bond head assembly to be substantially constant. Because a lower surface the bond head assembly (e.g., a lower surface of the bonding tool) is not against a surface (e.g., a "dummy" device at the bond site area, a surface of a calibration station, etc.), but is rather in air, the lower surface of the bond head assembly is free to grow (and contract). With the lower surface of the bond head assembly in air, the actual temperature cycle of the current bond process program (or another desirable temperature cycle) is applied. The z-axis growth (or contraction) of the lower surface may then be detected/measured, for example, using a displacement sensor (e.g., a capacitive displacement sensor, an interferometric displacement sensor, a triangulation based displacement sensor, a confocal displacement sensor, an optical displacement sensor, etc.). Such an exemplary displacement sensor 274 is shown in FIG. 3. This measured growth (and contraction) will approximate the growth (and contraction) that will occur during an actual/subsequent bonding process having the same process parameters (e.g., the same temperature cycle).

Of course, additional model bonding processes (in addition to those described herein) are contemplated to develop the data used in determining an appropriate z-axis position adjustment in accordance with the present invention.

Figure 1B:
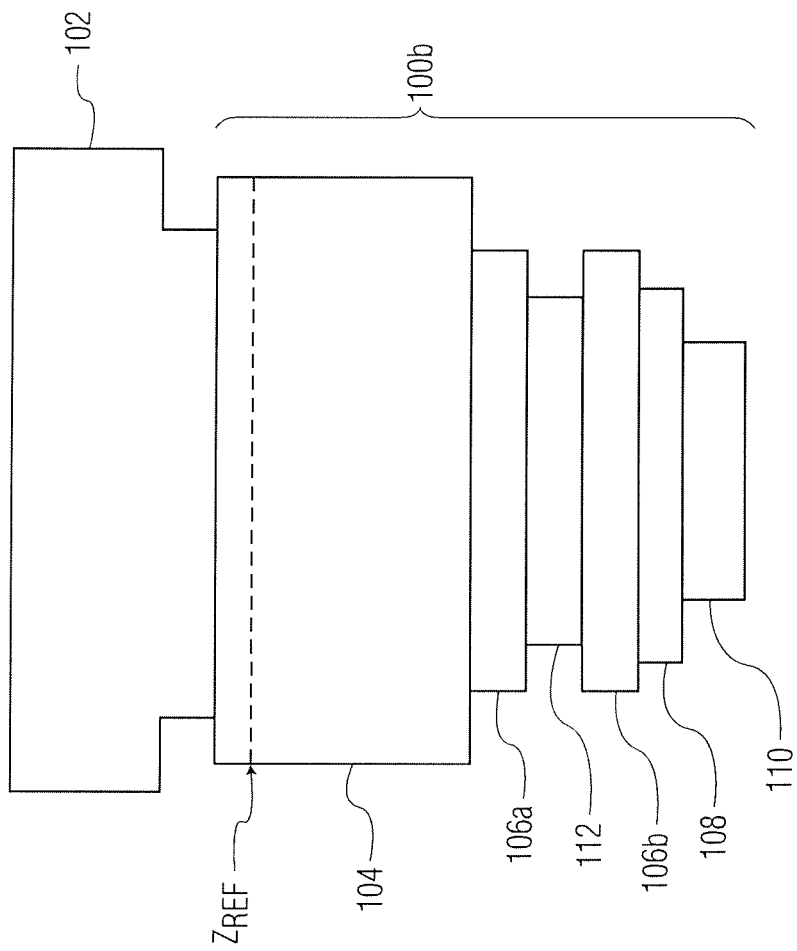

Referring now to the drawings, FIG. 1A illustrates bond head assembly 100a and motor 102 used for moving bond head assembly 100a. Bond head assembly 100a includes upper bond head 104, lower bond head 106, heater 108, and bonding tool 110. As will be appreciated by those skilled in the art, heater 108 and bonding tool 110 may be provided as a single element (i.e., a heated bond tool). A z-axis position $Z_{REF}$ is located on upper bond head 104, for example, and reflects the z-axis position monitored by a bond head z-axis position detector (e.g., a z-axis encoder, not shown). Of course, FIG. 1A illustrates only one exemplary bond head configuration, and many alternative configurations are contemplated. FIG. 1B illustrates one such alternative configuration. FIG. 1B illustrates bond head assembly 100b, and motor 102 used for moving bond head assembly 100b. Bond head assembly 100b includes upper bond head 104 (marked with position $Z_{REF}$), lower bond head "1"—106a, load cell 112, lower bond head "2"—106b, heater 108, and bonding tool 110. Load cell 112 may be, for example, a force sensor for measuring a downward force or an upward force (e.g., compression or tension) applied by bond head assembly 100b (e.g., a downward force applied by motor 102).

Figure 2A:
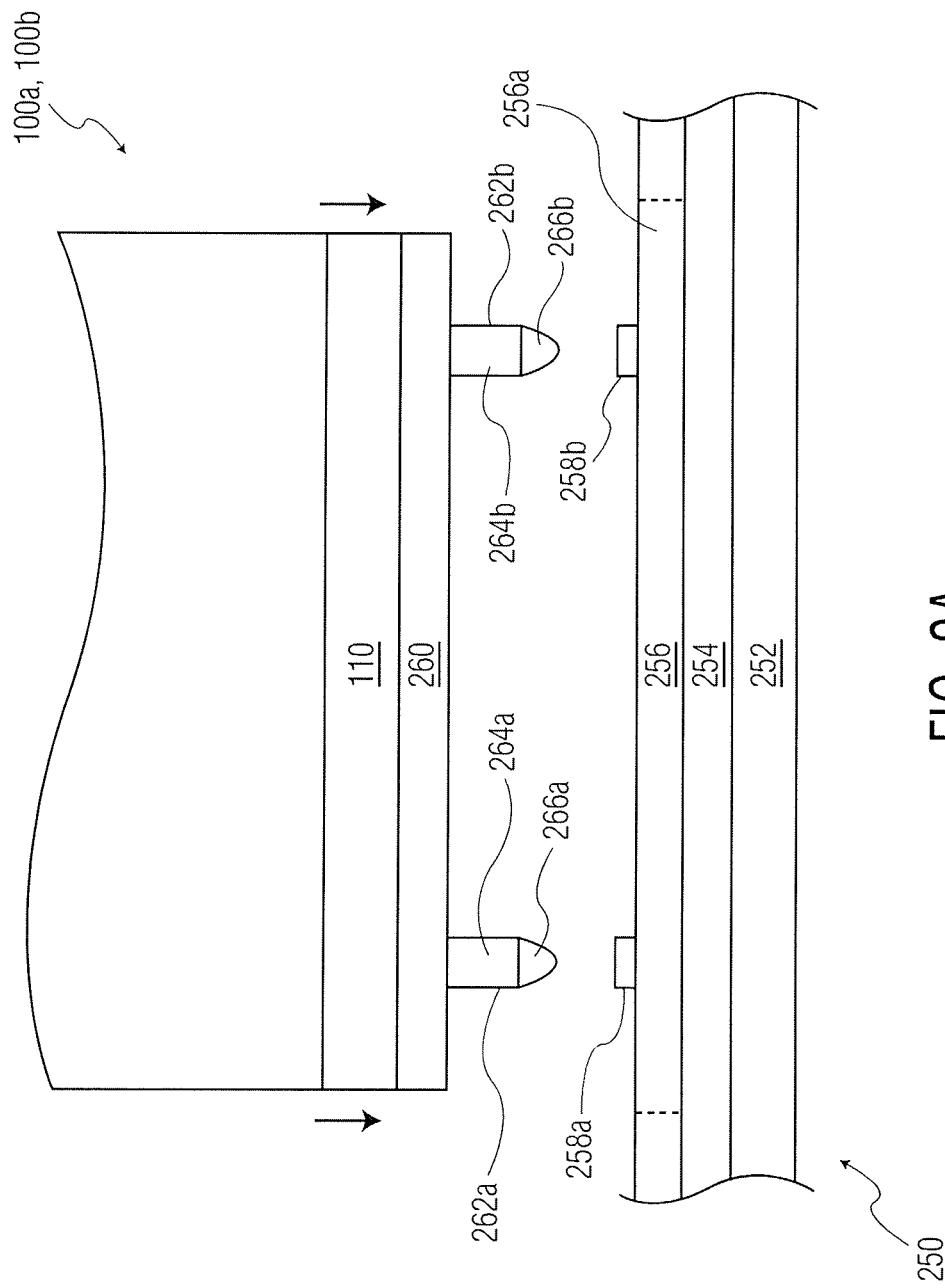
FIG. 2A is a block diagram side view illustrating a bonding tool descending in connection with a bonding operation in accordance with an exemplary embodiment of the present invention.
Figure 2B:
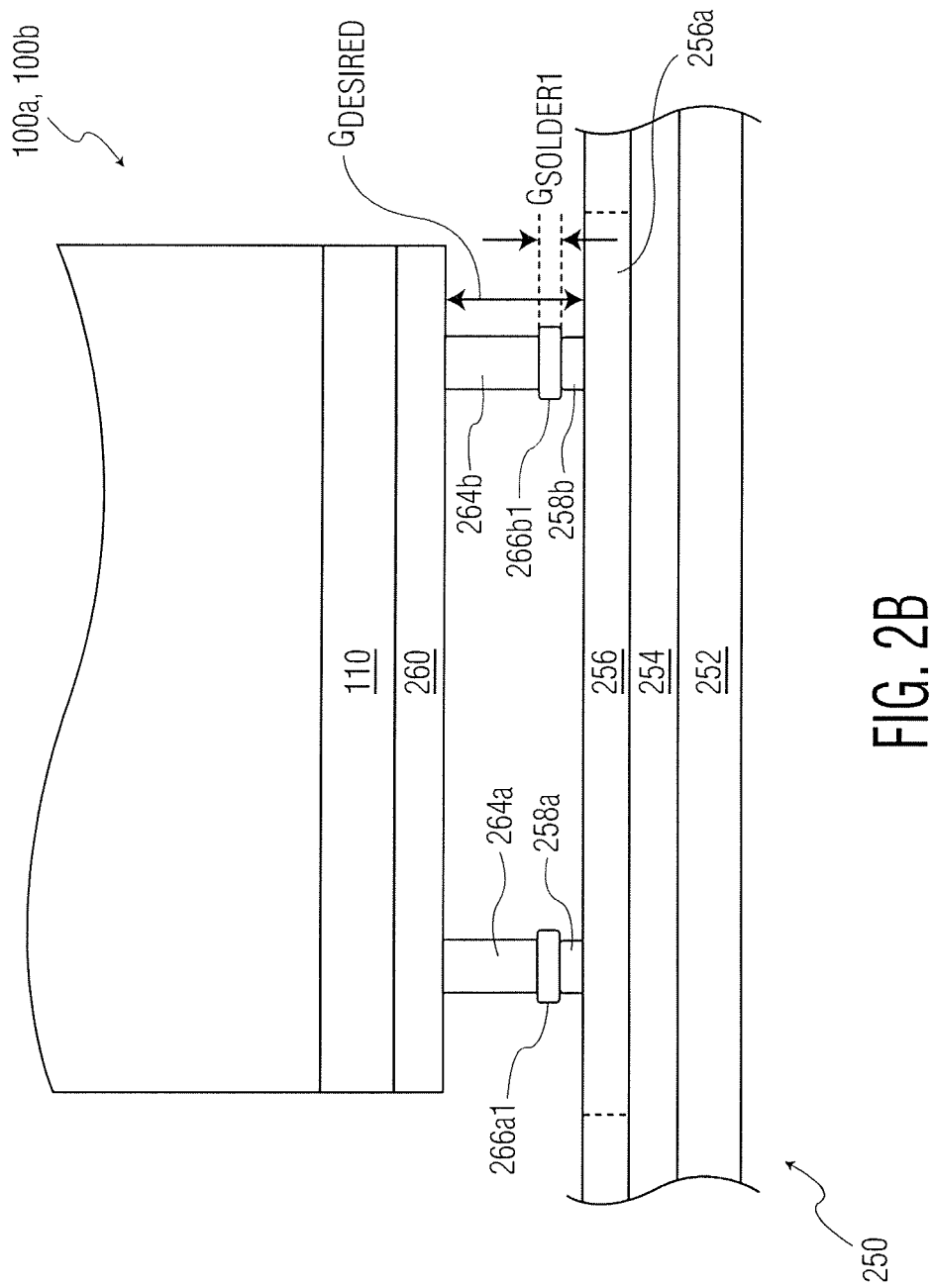
FIGS. 2B-2D are block diagram side views illustrating various semiconductor elements bonded to substrates, useful in explaining and illustrating various exemplary embodiments of the present invention.

FIG. 2A illustrates portions of bonding machine 250 (e.g., a thermocompressive flip chip bonding machine) including bond stage 252 (e.g., a shuttle, a heated shuttle, a heat block, an anvil, etc.), and support structure 254 supported by bond stage 252 (where support structure 254 and bond stage 252 may be integrated into a single element). Substrate 256 is supported by support structure 254, and includes a plurality of bonding locations 256a. Lower conductive structures 258a, 258b (e.g., conductive traces, conductive pads, etc.) are provided on substrate 256. Bonding machine 250 also includes bonding tool 110 (e.g., carried by bond head assembly 100a, 100b—see FIGS. 1A-1B) carrying semiconductor element 260. Upper conductive structures 262a, 262b (e.g., conductive pillars such as copper pillars, shown including pillar portions 264a, 264b and solder contact portions 266a, 266b) are provided on semiconductor element 260. Bonding tool 110 is lowered such that such that upper conductive structures 262a, 262b contact lower conductive structures 258a, 258b (e.g., see FIG. 2B). As illustrated in FIG. 2B, through a bonding process (e.g., a thermocompressive bonding process) solder contact portions 266a, 266b are melted, and then re-solidified as solder interfaces 266a1, 266b1—providing a permanent conductive coupling between ones of upper conductive structures 262a, 262b and lower conductive structures 258a, 258b. Although FIGS. 2A-2B illustrate only two pairs of conductive structures (pair 264a, 258a and pair 264b, 258b), this is of course a simplified example for ease of explanation. In practice, any number of pairs of conductive structures may be provided (e.g., tens of conductive structure pairs, hundreds of conductive structure pairs, etc.).

FIG. 2B also illustrates gap $G_{DESIRED}$ between a lower surface of semiconductor element 260 and an upper surface of substrate 256. It will be appreciated that it is important that gap $G_{DESIRED}$ be within an acceptable degree of tolerance; that is, if the gap is too small or too large, the solder material in solder contact portions 266a, 266b will not function to provide the desired conductive interconnect. In FIG. 2B, $G_{DESIRED}$ is shown within an acceptable degree of tolerance (hence it is "desired"), thereby resulting in a desirable gap of solidified solder material in solder interfaces 266a1, 266b1. The gap of the solidified solder material is shown as $G_{SOLDER1}$.

Figure 2C:
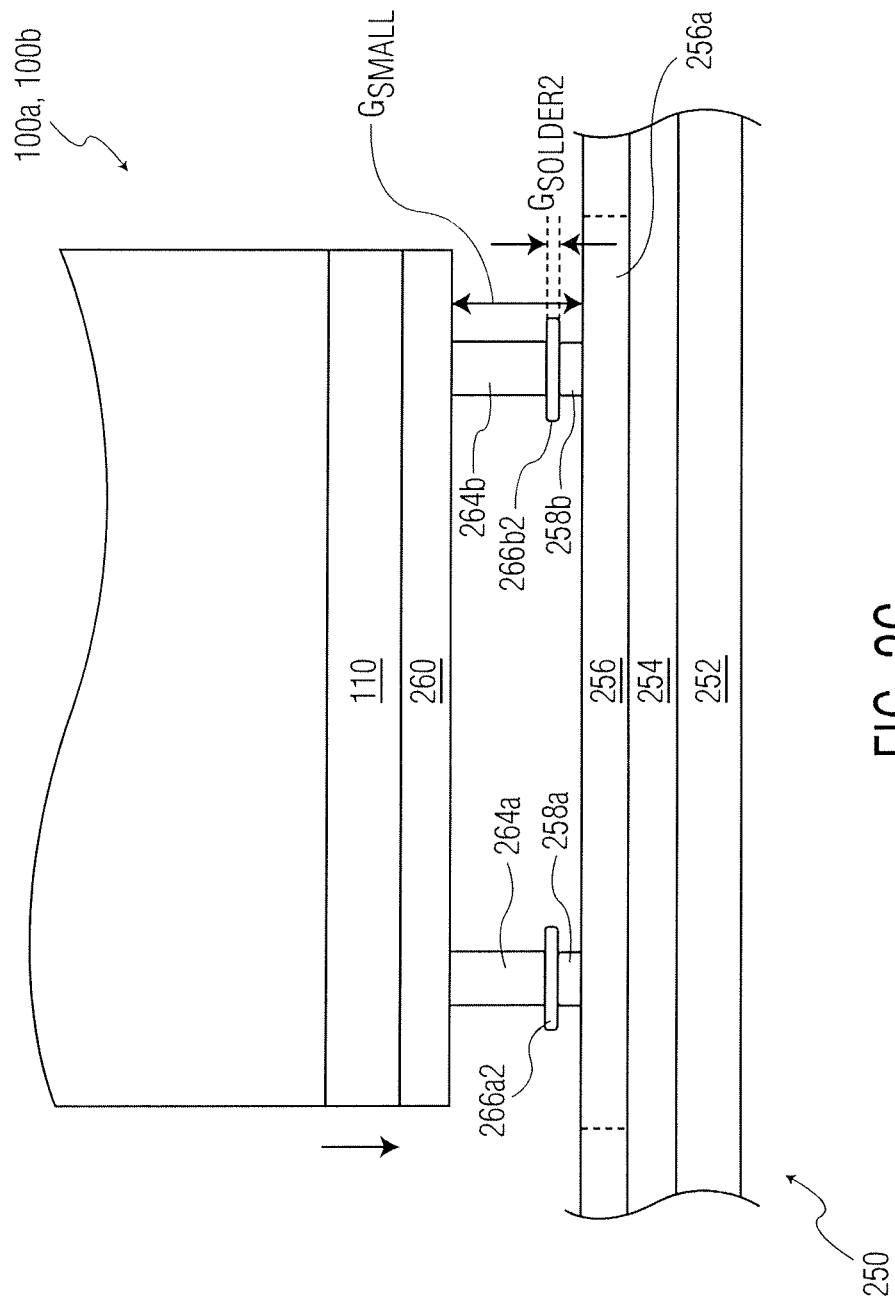

One problem that may occur is that, after the bonding process has begun (when the bond head assembly is in a desired bonding position along the z-axis)—if bond head assembly 100a, 100b expands, bonding tool 110 may be lowered to a level such that the gap between the lower surface of semiconductor element 260 and the upper surface of substrate 256 is not within an acceptable tolerance. This situation is shown in FIG. 2C, where the gap is labelled as $G_{SMALL}$ because of the expansion of elements of bond head assembly 100a, 100b (In FIG. 2C, each solder interface 266a2, 266b2 is shown in an undesirably deformed state because gap $G_{SOLDER2}$ is too small). In accordance with the present invention, bond head assembly 100a, 100b can be moved during the bonding process as needed to compensate for the expansion/contraction of elements of bond head assembly 100a, 100b.

Figure 2D:
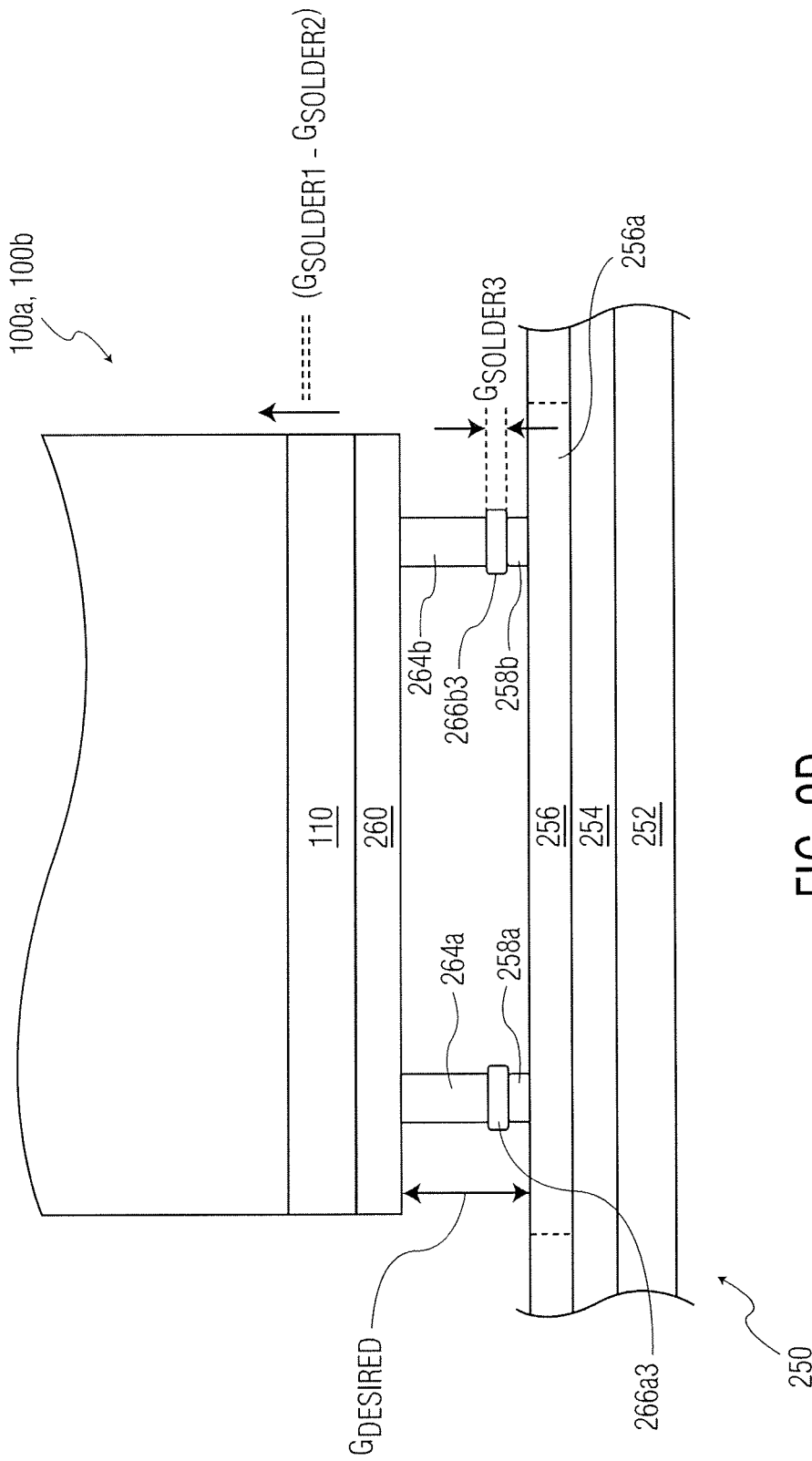

In FIG. 2D, bond head assembly 100a, 100b is shown as being raised to maintain the gap (i.e., $G_{DESIRED}$) within a desired tolerance after the expansion and contraction of bond head assembly 100a, 100b during a bonding cycle. In this example, a snapshot in time is shown where bond head assembly 100a, 100b is being raised (e.g., see the arrow) by an amount equal to $G_{SOLDER1}$ minus $G_{SOLDER2}$, as this difference should be approximately equal to the amount that bond head assembly 100a, 100b has expanded downward along the z-axis. Resulting solder interfaces 266a3, 266b3 define a gap $G_{SOLDER3}$ that is substantially equal to $G_{SOLDER1}$ shown in FIG. 2B. While FIG. 2D illustrates bond head assembly 100a, 100b being raised at a moment in time, it should be understood that the process of adjusting the position of bond head assembly 100a, 100b may involved many movements over the course of the bonding process.

FIG. 3 is an overhead block diagram view of bonding machine 250. As in FIGS. 2A-2D, FIG. 3 illustrates bond head assembly 100a, 100b and substrate 256 supported by support structure 254. As shown in FIG. 3, exemplary bond head assembly 100a, 100b moves along a y-axis motion path, a z-axis motion path (the path illustrated in FIGS. 2A-2D), and about a theta (θ) axis. Exemplary support structure 254 is shown as being moveable along an x-axis motion path (e.g., through movement of bond stage 252, not shown in FIG. 3). FIG. 3 also illustrates additional substrates 256 to the left and to the right of support structure 254, which are intended to represent the input and output indexing systems (not shown). These systems are configured to: acquire a substrate from a substrate supply (e.g., an input cassette); move the substrate from the substrate supply to the support structure; and then, after bonding of semiconductor elements to the substrate is complete, move the now-bonded substrate to an output supply (e.g., an output cassette). FIG. 3 also illustrates computer system 270 and calibration station 268. Displacement sensor 274 is also illustrated. As provided above, in certain exemplary embodiments of the present invention, a displacement sensor is used to measure z-axis growth of the bond head, for example, in air. It will be appreciated by those skilled in the art that calibration station 268 may include a surface against which a lower surface of bond head assembly 100a, 100b (e.g., the lower surface of the bonding tool) is positioned against. However, in embodiments of the present invention wherein the z-axis height measurement characteristic of the bond head assembly is measured "in air", calibration station 268 (or another calibration station) may include a displacement sensor (e.g., displacement sensor 274). Of course, and as described herein, any such calibration station may be located at or away from the support structure (e.g., at any location on the machine accessible by the bond head assembly).

According to the present invention, the z-axis position of a bond head assembly is adjusted (e.g., using a z-axis motor, such as motor 102 described above) during the bonding process in order to compensate for expansion/contraction caused by the heating and cooling of the bond head assembly during the bonding process. According to certain embodiments of the present invention, a model bonding process is performed in order to determine how to adjust the z-axis position of the bond head during an actual bonding process (see, e.g., FIG. 5). The model bonding process may be performed at the actual bond site (e.g., where an element of bond head assembly 100a, 100b, such as bonding tool 110, contacts substrate 256, support structure 254, bond stage 252, or some other component positioned at the bond site). Alternatively, it may be desirable to provide a separate calibration station (e.g., calibration station 268). In FIG. 3, calibration station 268 is shown in a position adjacent (and actually coupled to, directly or indirectly) support structure 254 and/or bond stage 252 (not visible, but positioned below support structure 254 as shown in FIGS. 2A-2D), such that when support structure 254 moves calibration station 268 also moves. Of course, calibration station 268 does not need to be in this location (and need not move with support structure 254), and may be positioned at any location of bonding machine 250 as desired.

Figure 4:
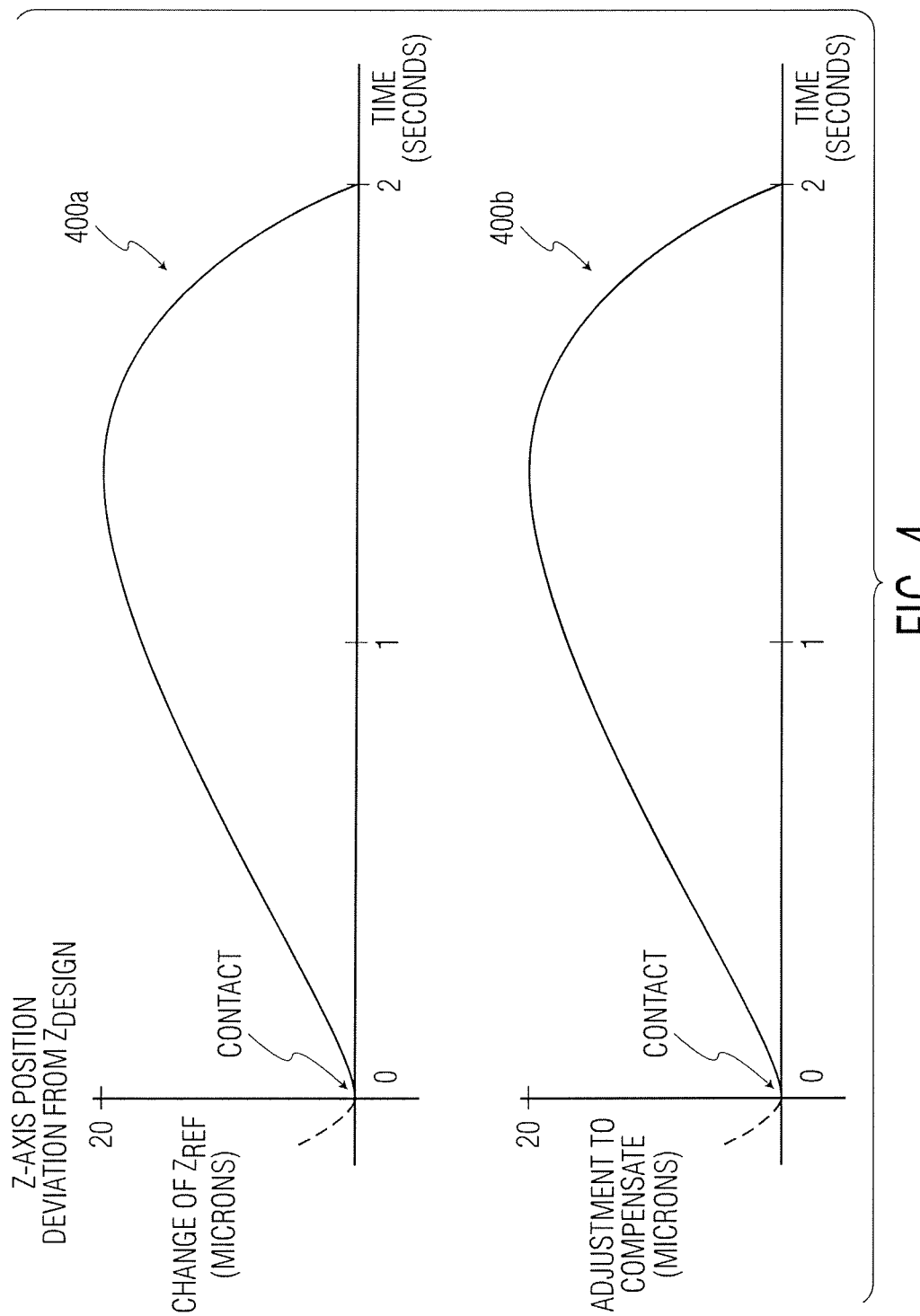
FIG. 4 is a graphical representation illustrating a correlation between a z-axis position change of a portion of a bond head assembly during a bonding process, and a z-axis adjustment during a bonding process, in accordance with an exemplary embodiment of the present invention.

FIG. 4 illustrates 2 graphs. The upper graph (curve 400a) illustrates a z-axis position deviation from a design z-axis position ($Z_{DESIGN}$) during a bonding process. That is, in connection with a bonding process, bond head assembly 100a, 100b is lowered to a z-axis position ($Z_{DESIGN}$) where bonding will be conducted. In each graph of FIG. 4 (i.e., curves 400a, 400b), the descent of bond head assembly 100a, 100b to $Z_{DESIGN}$ is shown as a dashed line (to the left of time 0), where contact between a lower surface of bonding tool 110 and substrate 256 occurs at time "0" marked "CONTACT". Then, during the bonding process (which in this example lasts about 2 seconds), heating causes expansion of elements of bond head assembly 100a, 100b such that $Z_{REF}$ (the portion of bond head assembly 100a, 100b being monitored) changes as shown in the upper graph (curve 400a). Without compensation, this change in the position from $Z_{DESIGN}$ (caused by expansion of elements of bond head assembly 100a, 100b) could cause the deformation of the solder material (see, e.g., solder interface 266a1, 266b1 in FIG. 2B) to an unacceptable level (see, e.g., solder interface 266a2, 266b2 in FIG. 2C). Compensation is provided as shown in the lower graph of FIG. 4 (curve 400b). That is, bond head assembly 100a, 100b is moved (e.g., using motor 102) during the bonding process as shown in the lower graph. To the extent practical, bond head assembly 100a, 100b is moved (raised) in the lower graph to compensate for the changing position of $Z_{REF}$ shown in the upper graph. This dynamic compensation may occur through any of a number of position adjustments (e.g., 100 adjustments per second, 1000 adjustments per second, etc.). The position adjustment shown in curve 400b may be considered a z-axis adjustment (or z-axis adjustment profile) for use in various methods of the present invention (e.g., the z-axis adjustment profile of Step 502 in FIG. 5, the z-axis adjustment of Step 704 in FIG. 7).

Figure 5:
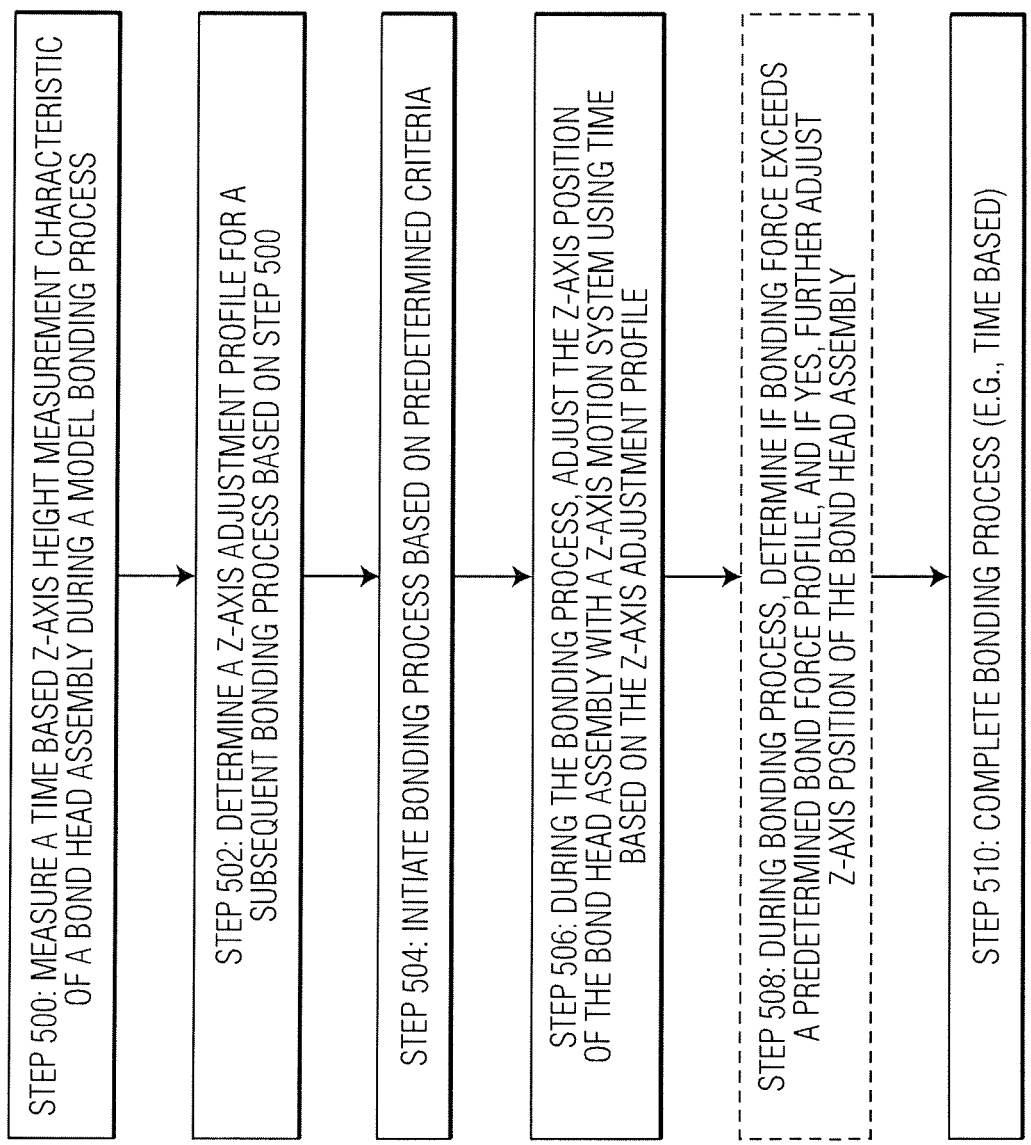
FIG. 5 is a flow diagram illustrating a method of operating a bonding machine for bonding semiconductor elements in accordance with an exemplary embodiment of the present invention.
Figure 7:
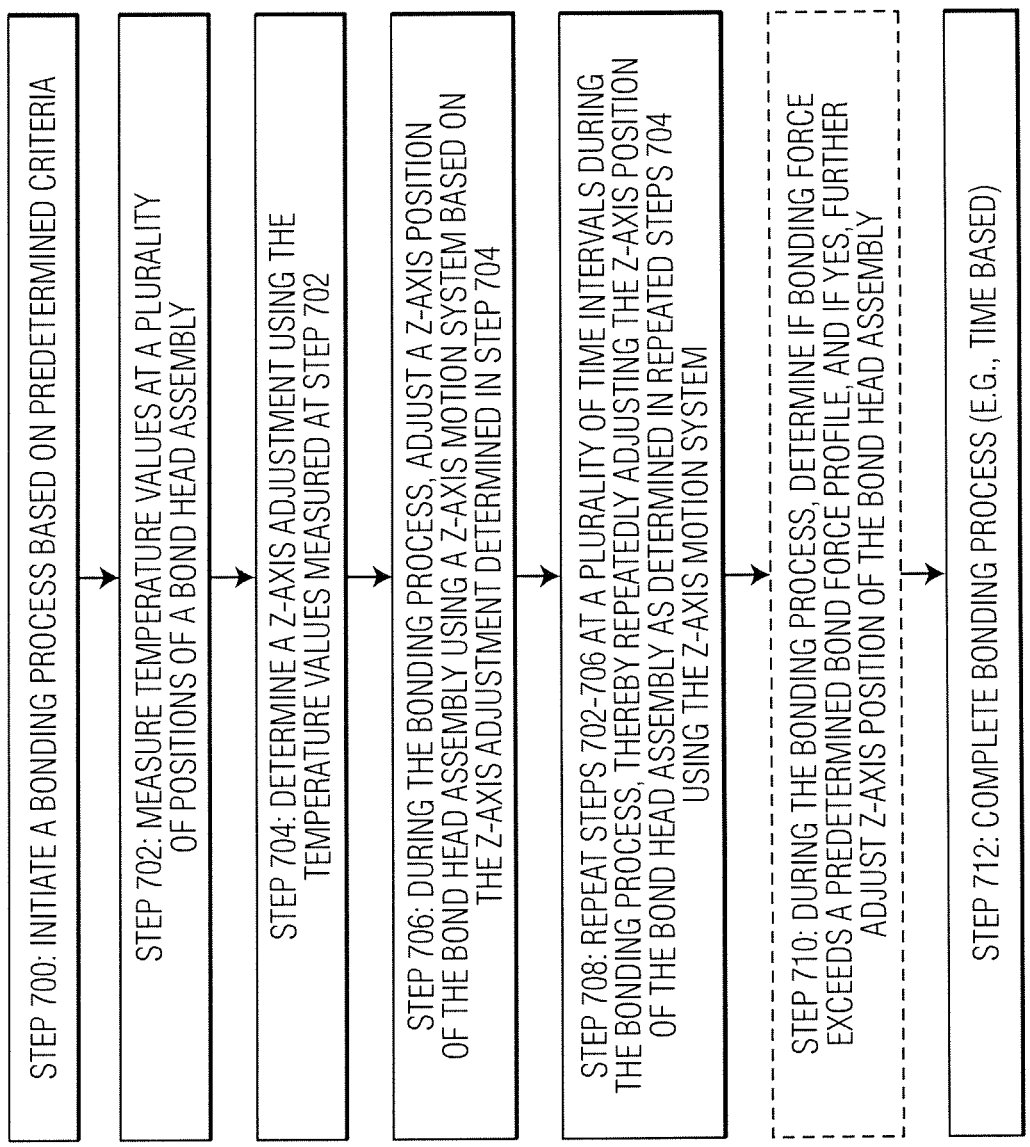
FIG. 7 is a flow diagram illustrating another method of operating a bonding machine for bonding semiconductor elements in accordance with an exemplary embodiment of the present invention.

FIGS. 5 and 7 are flow diagrams in accordance with exemplary embodiments of the present invention. As is understood by those skilled in the art, certain steps included in the flow diagrams may be omitted; certain additional steps may be added; and the order of the steps may be altered from the order illustrated.

FIG. 5 illustrates a method of operating a bonding machine for bonding semiconductor elements. At Step 500, a time based z-axis height measurement characteristic of a bond head assembly is measured during a model bonding process. For example, the model bonding process may be conducted at the bond site area (e.g., with a lower surface of bonding tool 110 contacting a substrate (such as substrate 256, or a different "dummy" substrate, etc.), or contacting support structure 254 directly, or contacting bond stage 252 directly, etc.). Alternatively, a separate calibration station (such as calibration station 268 shown in FIG. 3) may be used, where bonding tool 110 contacts a contact region of the calibration station. In any event, during the model bonding process, a lower surface (e.g., a face) of the bonding tool is brought into contact with a stationary surface (e.g., a substrate, etc.), and the bonding process is imitated (e.g., including the application of a predetermined temperature profile using a bond head assembly heater, etc.). Preferably, bond head assembly 100a, 100b is kept at a constant force during this model bonding process. Z-axis height measurements of bond head assembly 100a, 100b (e.g., using $Z_{REF}$ as shown in FIGS. 1A-1B) are retrieved at a plurality of times during the model bonding process. For example, referring to the upper graph of FIG. 4, and starting at time 0, z-axis height measurements are retrieved following curve 400a. These z-axis height measurements are estimates of the expansion and contraction of bond head assembly 100a, 100b during an actual subsequent bonding process. At Step 502, a z-axis adjustment profile for a subsequent bonding process is determined based on Step 500. With reference to the example shown in FIG. 4, the lower graph illustrates curve 400b which may be considered a z-axis adjustment profile determined based on the z-axis height measurements retrieved from the model bonding process (i.e., curve 400a of FIG. 4). At Step 504, a bonding process (i.e., an actual or subsequent bonding process, as opposed to the model bonding process of Step 500) is initiated based on predetermined criteria. For example, this predetermined criteria may be criteria used to determine that contact has been established between a lower surface of bonding tool 110 and substrate 256, where such contact may be predicted by monitoring at least one of a bond head assembly velocity characteristic, a bond head assembly force characteristic, and a bond head assembly position. At Step 506, during the bonding process, the z-axis position of the bond head assembly is adjusted with a z-axis motion system using time based on the z-axis adjustment profile. For example, referring again to the lower graph of FIG. 4, the bonding cycle is approximately 2 seconds as shown in curve 400b. During this 2 second bonding cycle, bond head assembly 100a, 100b will be moved a plurality of times (e.g., hundreds of times) to generally follow curve 400b. Through this movement of bond head assembly 100a, 100b to follow curve 400b, gap $G_{DESIRED}$ (e.g., see FIG. 2D) is substantially kept at the same level (or at least within an acceptable level of tolerance). At optional Step 508, during the bonding process, a determination is made as to whether the bonding force being applied exceeds a predetermined bond force profile. That is, as an added level of protection against the lower surface of bonding tool 110 undesirably deforming the solder material (e.g., solder material 266a, 266b shown in FIG. 2A), the bond force applied by bond head assembly is checked (e.g., continuously during the bonding process), for example, using load cell 112 (e.g., shown in FIGS. 1B and 6B). This measured bond force is compared to a predetermined bond force profile (which may be a single level of force, or may be a time based force profile). If the measured bonding force does not exceed the predetermined bond force profile, the process continues until the bond is complete at Step 510. If the measured bonding force does exceed the predetermined bond force profile, the z-axis position of bond head assembly 100a, 100b is further adjusted (e.g., raised). The magnitude (or profile) of this further adjustment may be determined by computer system 270 (e.g., see FIG. 3) by relating the actual force measured to data included in memory.

Figure 6A:
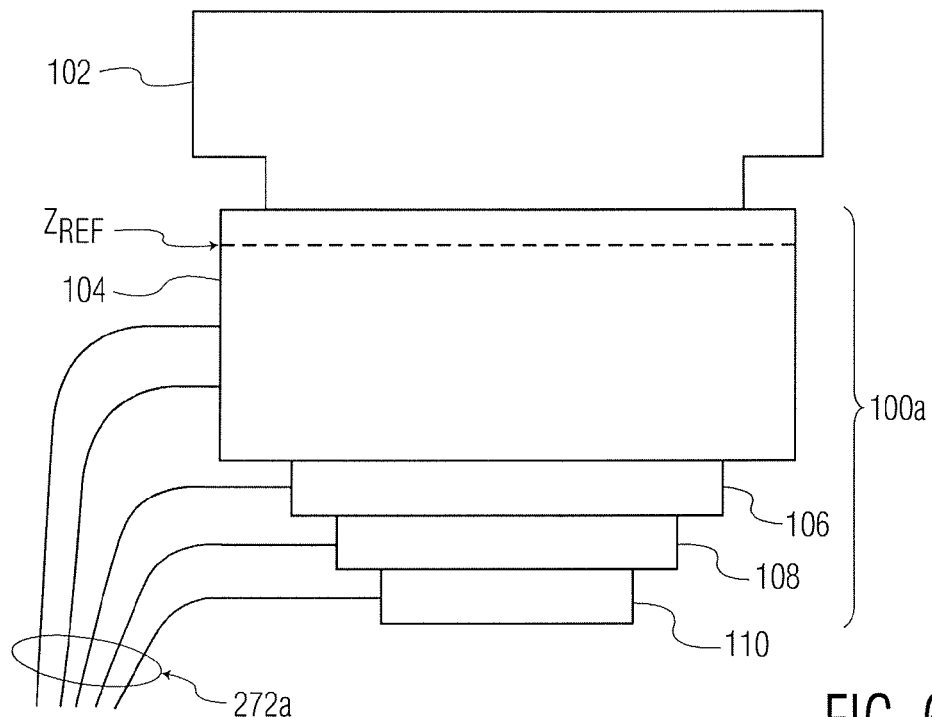
FIGS. 6A-6B are block diagram side views illustrating elements of bonding machines useful for explaining various exemplary embodiments of the present invention.
Figure 6B:
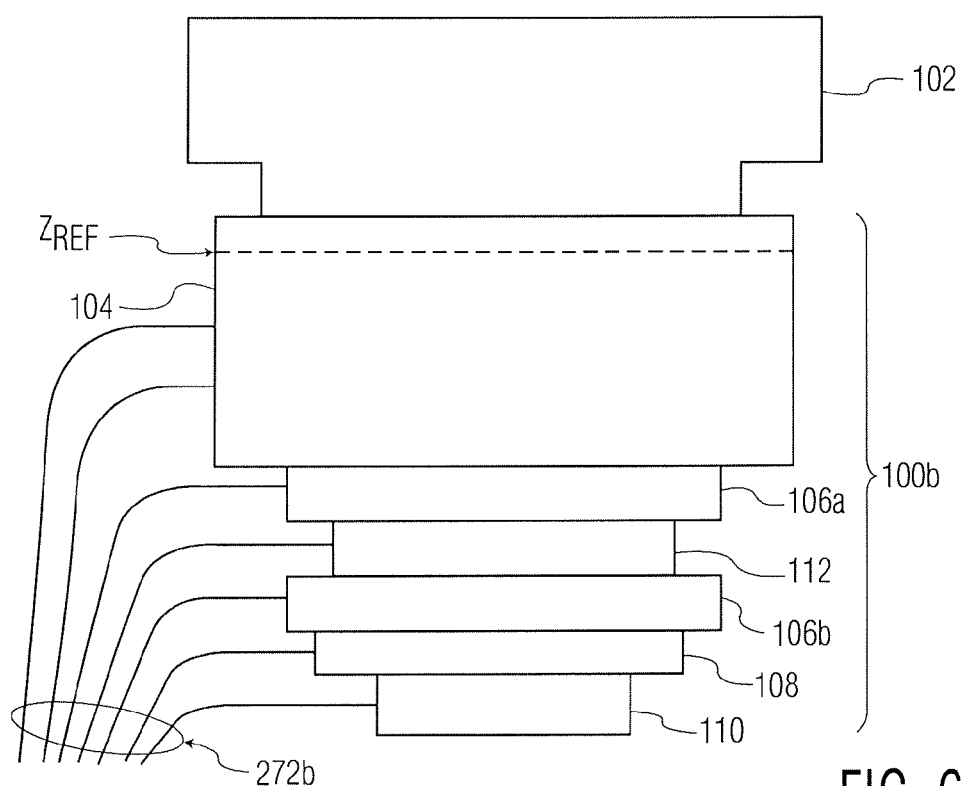

According to certain exemplary embodiments of the present invention, temperature sensors may be used to retrieve actual temperature values from different locations of the bond head assembly. Such retrieved temperature values may be used to adjust the z-axis position of the bond head assembly to compensate for it's expansion/contraction during the bonding process. More specifically, the bonding machine has access to data (e.g., stored in memory of the bonding machine, or otherwise accessible by the bonding machine). This data includes relationships between temperature values and z-axis adjustments. That is, at a given time, temperature values are retrieved using the temperature sensors, and these temperature values may be used by a computer system (e.g., computer system 270 shown in FIG. 3) to determine an appropriate z-axis adjustment through access to the stored data. FIGS. 6A-6B illustrates bond head assemblies 100a, 100b previously illustrated and described in connection with FIGS. 1A-1B. Temperature sensors (e.g., thermocouples or other sensors) are coupled (either directly or indirectly) to various locations of each bond head assembly 100a, 100b. Temperature sensor leads 272a bring temperature data from temperature sensors at various locations of bond head assembly 100a, while temperature sensor leads 272b bring temperature data from temperature sensors at various locations of bond head assembly 100b. Of course, different or additional temperature sensors may be used (e.g., such as non-contact temperature sensors, such as infrared sensors, etc.), at different or additional locations of each respective bond head assembly 100a, 100b.

FIG. 7 illustrates a method of operating a bonding machine for bonding semiconductor elements. At Step 700, a bonding process is initiated based on predetermined criteria. For example, this predetermined criteria may be criteria used to determine that contact has been established between a lower surface of bonding tool 110 and substrate 256, where such contact may be predicted by monitoring at least one of a bond head assembly velocity characteristic, a bond head assembly force characteristic, and a bond head assembly position. At Step 702, temperature values are measured at a plurality of positions of a bond head assembly. For example, FIGS. 6A-6B illustrate temperature sensor leads 272a, 272b for retrieving temperature values from a plurality of positions of bond head assemblies 100a, 100b. At Step 704, a z-axis adjustment is determined using the temperature values measured at Step 702. With reference to the example shown in FIG. 4, the lower graph illustrates curve 400b which may be considered a z-axis adjustment profile determined based on the temperature measurements in connection with data accessible by computer 270 (e.g., data that correlates the various temperature measurements at the various positions of bond head assembly 100a, 100b to z-axis position adjustments, which data may have been generated using a model bonding process as described above). At Step 706, during the bonding process, a z-axis position of the bond head assembly is adjusted using a z-axis motion system based on the z-axis adjustment determined in Step 704. At Step 708, Steps 702-706 are repeated at a plurality of time intervals during the bonding process, thereby repeatedly adjusting the z-axis position of the bond head assembly as determined in repeated Steps 704 using the z-axis motion system. For example, referring again to the lower graph of FIG. 4, the bonding cycle is approximately 2 seconds as shown in curve 400b. During this 2 second bonding cycle, bond head assembly 100a, 100b will be moved a plurality of times (e.g., hundreds of times) to generally follow curve 400b. This movement may be considered to be the adjustments of repeated Step 706 (which is repeated by Step 708). Through this movement of bond head assembly 100a, 100b to follow curve 400b, gap $G_{DESIRED}$ (e.g., see FIG. 2D) is substantially kept at the same level (or at least within an acceptable level of tolerance).

At Step 710, during the bonding process (e.g., any time during the bonding process as desired, on a given time interval, which may coincide with Steps 700-708), a determination is made as to whether the bonding force being applied exceeds a predetermined bond force profile. That is, as an added level of protection against the lower surface of bonding tool 110 undesirably deforming the solder material (e.g., solder material 266a, 266b shown in FIG. 2A), the bond force applied by bond head assembly is checked (e.g., continuously during the bonding process), for example, using load cell 112 (e.g., shown in FIGS. 1B and 6B). This measured bond force is compared to a predetermined bond force profile (which may be a single level of force, or may be a time based force profile). If the measured bonding force does not exceed the predetermined bond force profile, the process continues until the bond is complete at Step 712. If the measured bonding force does exceed the predetermined bond force profile, the z-axis position of bond head assembly 100a, 100b is further adjusted (e.g., raised). The magnitude (or profile) of this further adjustment may be determined by computer system 270 (e.g., see FIG. 3) by relating the actual force measured to data included in memory.

It will be appreciated by those skilled in the art that FIG. 7 may also represent a hybrid approach (e.g., utilizing the teachings of FIG. 5 and FIG. 7). That is, upon initiating the bonding process at Step 700, an initial z-axis adjustment profile may be utilized, for example, by performing a model bonding process as described herein (e.g., as described above in connection with FIG. 5). Then, after measuring the temperature values at Step 702, a further z-axis adjustment is determined at Step 704 (i.e., a further adjustment as compared to the intended initial z-axis adjustment profile utilized to begin the bonding process). Then, as Steps 702-706 are repeated (i.e., at Step 708) further adjustments and/or deviations may be made from the initial z-axis adjustment profile.

The various processes described herein (e.g., the processes described in connection with FIGS. 5 and 7) may be performed at any desired interval. Of course, certain aspects of the methods recited herein are generally performed during all bonding cycles (e.g., the adjustment of the z-axis position such as recited in Step 506 of FIG. 5, and Step 706 of FIG. 7). However, certain aspects of the present invention may desirably be performed again (e.g., to ensure accuracy, etc.). For example, the model bonding process described above with respect to FIG. 5, and the corresponding generation of a z-axis adjustment profile (i.e., Steps 500 and 502 of FIG. 5) may be repeated at any desired interval.

According to certain exemplary embodiments of the present invention, a recalibration of the z-axis adjustment profile may be desirable. That is, certain detected process characteristics may result (e.g., automatically, as configured in the machine software and architecture) in the recalibration of the z-axis adjustment profile. For example, if the bonding force applied exceeds a predetermined threshold, or varies from a predetermined profile beyond a predetermined tolerance (e.g., as determined during step 508 of FIG. 5, as determined during step 710 of FIG. 7, or as determined through any bond force measurement, etc.), then a recalibration of the z-axis adjustment profile may result. Another exemplary process characteristic which may result in a recalibration of the z-axis adjustment profile is a temperature measurement (e.g., a temperature measured at a given bond head location exceeding a predetermined threshold, a temperature profile of one or more bond head locations varying from a predetermined temperature profile beyond a predetermined tolerance, etc.). Of course, other process characteristics may also result in the recalibration. When it is determined that a recalibration is desired (e.g., using any desired process characteristic(s)), then the recalibration may be performed, for example, using any technique disclosed herein in connection with the present invention (e.g., as set forth in FIG. 5, as set forth in FIG. 7, etc.) or using another desired technique.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A bonding machine for bonding semiconductor elements, the bonding machine comprising:
   a bond head assembly including a bonding tool for bonding semiconductor elements to a substrate;
   a support structure for supporting the substrate during bonding of the semiconductor elements to the substrate;
   a calibration station used in connection with the bond head assembly for measuring a time based z-axis height measurement characteristic of the bond head assembly during a model bonding process; and
   a computer for determining a z-axis adjustment profile to provide compensation during a subsequent bonding process based on the measured time based z-axis height measurement characteristic.

2. The bonding machine of claim 1 wherein the calibration station is coupled to the support structure and moves along with the support structure along at least one motion axis.

3. The bonding machine of claim 1 wherein the calibration station includes a contact surface configured to be contacted by the bonding tool during the model bonding process.

4. The bonding machine of claim 1 further comprising a plurality of temperature sensors attached to a plurality of locations of the bond head assembly.

5. The bonding machine of claim 1 wherein the bond head assembly includes a force sensor for measuring a downward force applied by the bond head assembly.

6. The bonding machine of claim 1 further comprising a displacement sensor for measuring the time based z-axis height measurement characteristic in connection with the calibration station.

7. The bonding machine of claim 1 wherein the bonding machine is a thermocompression bonding machine.

8. The bonding machine of claim 1 wherein the bonding machine is a flip chip bonding machine.

9. The bonding machine of claim 1 wherein the bonding tool is configured to melt solder bumps on a semiconductor element in connection with the bonding of the semiconductor element to the substrate.

10. The bonding machine of claim 1 further comprising a servo controlled motion system to control a height of the bonding tool.

11. The bonding machine of claim 1 further comprising a z-axis encoder for providing z-axis position information.

12. The bonding machine of claim 1 wherein the z-axis position information from the z-axis encoder is used to measure growth of the bond head assembly.

13. The bonding machine of claim 1 wherein the bonding tool is a heated bonding tool.

14. The bonding machine of claim 1 wherein the bond head assembly includes a force sensor for measuring a force applied by the bond head assembly.

15. A bonding machine for bonding semiconductor elements, the bonding machine comprising:
   a bond head assembly including a bonding tool for bonding semiconductor elements to a substrate;
   a support structure for supporting the substrate;
   a calibration station used in connection with the bond head assembly for measuring a time based z-axis height measurement characteristic of the bond head assembly during a model bonding process; and
   a computer for determining a z-axis adjustment profile to provide compensation during a subsequent bonding process based on the measured time based z-axis height measurement characteristic, wherein the calibration station is coupled to the support structure and moves along with the support structure along at least one motion axis.

* * * * *